US009992445B1

(12) United States Patent
Hundemer et al.

(10) Patent No.: US 9,992,445 B1
(45) Date of Patent: *Jun. 5, 2018

(54) SYSTEMS AND METHODS FOR IDENTIFYING A VIDEO ASPECT-RATIO FRAME ATTRIBUTE

(71) Applicant: Tribune Broadcasting Company, LLC, Chicago, IL (US)

(72) Inventors: Hank J. Hundemer, Bellevue, KY (US); Dana A. Lasher, Morgan Hill, CA (US)

(73) Assignee: Tribune Broadcasting Company, LLC, Chicago, IL (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/457,629

(22) Filed: Mar. 13, 2017

Related U.S. Application Data (63) Continuation of application No. 14/709,120, filed on May 11, 2015, now Pat. No. 9,621,844, which is a continuation of application No. 14/247,605, filed on Apr. 8, 2014, now Pat. No. 9,064,181, which is a continuation of application No. 13/629,495, filed on Sep. 27, 2012, now Pat. No. 8,731,285.

(60) Provisional application No. 61/542,077, filed on Sep. 30, 2011, provisional application No. 61/542,103, filed on Sep. 30, 2011.

(51) Int. Cl.
*G06K 9/00* (2006.01)
*H04N 7/01* (2006.01)

(52) U.S. Cl.
CPC .................. *H04N 7/0125* (2013.01)

(58) Field of Classification Search
CPC .... G06K 9/4661; G06K 9/4652; G06T 7/408; G06T 5/001; G06T 11/001; G06F 17/30243; H04N 1/6058; H04N 9/045; H04N 7/025; H04N 7/0125; H04N 17/00
See application file for complete search history.

(56) References Cited

U.S. PATENT DOCUMENTS

| 5,027,212 | A | * | 6/1991 | Marlton | G09G 1/16 345/213 |
| 5,159,438 | A | * | 10/1992 | Rabii | H04N 7/0122 348/441 |
| 5,291,295 | A | * | 3/1994 | Srivastava | H04N 7/0122 348/555 |

(Continued)

*Primary Examiner* — Amir Alavi
(74) *Attorney, Agent, or Firm* — McDonnell Boehnen Hulbert & Berghoff LLP (57) ABSTRACT

Presently disclosed are systems and method for identifying a video aspect-ratio frame attribute of a current frame. One example embodiment takes the form of a frame-processing device including a processor and a non-transitory computer-readable medium containing instructions that, when executed by the processor, cause a set of steps to be carried out, the set of steps including: (i) receiving a frame of video from a video source device; (ii) defining a region of the received frame, wherein the region is associated with a plurality of pixels of the received frame; (iii) using a plurality of luma values associated with the plurality of pixels as a basis to identify the received frame as having a particular video aspect-ratio attribute; and (iv) storing in a memory an indication that the received frame has the identified particular video aspect-ratio frame attribute.

20 Claims, 5 Drawing Sheets

(56) References Cited

U.S. PATENT DOCUMENTS

| | | | | |
|---|---|---|---|---|
| 6,195,458 | B1* | 2/2001 | Warnick | G11B 27/28 |
| | | | | 348/700 |
| 6,606,409 | B2* | 8/2003 | Warnick | G11B 27/28 |
| | | | | 348/700 |
| 6,721,361 | B1* | 4/2004 | Covell | G11B 27/031 |
| | | | | 348/594 |
| 6,724,933 | B1* | 4/2004 | Lin | G06K 9/00711 |
| | | | | 345/591 |
| 6,778,224 | B2* | 8/2004 | Dagtas | H04N 5/44508 |
| | | | | 348/584 |
| 7,557,861 | B2* | 7/2009 | Wyman | G11B 27/022 |
| | | | | 348/441 |
| 8,433,108 | B2* | 4/2013 | Bateman | G06F 17/30811 |
| | | | | 382/124 |
| 8,731,285 | B1* | 5/2014 | Hundemer | H04N 17/00 |
| | | | | 382/165 |
| 8,761,452 | B2 | 6/2014 | Bateman | |
| 9,064,181 | B1* | 6/2015 | Hundemer | H04N 17/00 |
| 9,621,844 | B1* | 4/2017 | Hundemer | H04N 7/025 |
| 2006/0026628 | A1 | 2/2006 | Wan et al. | |
| 2009/0249386 | A1 | 10/2009 | Shan et al. | |
| 2013/0182755 | A1 | 7/2013 | Chen et al. | |
| 2014/0192904 | A1 | 7/2014 | Rosewarne | |

* cited by examiner

SYSTEMS AND METHODS FOR IDENTIFYING A VIDEO ASPECT-RATIO FRAME ATTRIBUTE

CROSS REFERENCES TO RELATED APPLICATIONS

This application is a continuation of U.S. patent application Ser. No. 14/709,120, entitled "Systems and Methods for Identifying a Video Aspect-Ratio Frame Attribute," filed on May 11, 2015, which is a continuation of U.S. patent application Ser. No. 14/247,605, entitled "Systems and Methods for Identifying a Video Aspect-Ratio Frame Attribute," filed on Apr. 8, 2014 (now U.S. Pat. No. 9,064,181), which is a continuation of U.S. patent application Ser. No. 13/629,495, entitled "Systems and Methods for Identifying a Video Aspect-Ratio Frame Attribute," filed on Sep. 27, 2012 (now U.S. Pat. No. 8,731,285), which claims priority to (i) U.S. Provisional Patent Application Ser. No. 61/542,077, entitled "System and Method for Automated Video Content Tagging," filed on Sep. 30, 2011 and (ii) U.S. Provisional Patent Application Ser. No. 61/542,103, entitled "System and Method for a Master Controller," filed on Sep. 30, 2011, all of which are hereby incorporated by reference herein in their entirety.

This application also relates to U.S. patent application Ser. No. 13/629,405, entitled "Systems and Methods for Identifying a Black/Non-Black Frame Attribute," U.S. patent application Ser. No. 13/629,481, entitled "Systems and Methods for Identifying a Colorbar/Non-Colorbar Frame Attribute," U.S. patent application Ser. No. 13/629,446, entitled "Systems and Methods for Identifying a Scene-Change/Non-Scene-Change Transition Between Frames," U.S. patent application Ser. No. 13/629,430, entitled "Systems and Methods for Identifying a Mute/Sound Frame Attribute," and U.S. patent application Ser. No. 13/629,497, entitled "Systems and Methods for Electronically Tagging a Video Component in a Video Package," all of which are commonly assigned to the assignee of the present application, and are hereby incorporated by reference herein in their entirety.

USAGE AND TERMINOLOGY

Throughout this application, with respect to all reasonable derivatives of such terms, and unless otherwise specified (and/or unless the particular context clearly dictates otherwise), each usage of:

"a" or "an" is meant to read as "at least one."
"the" is meant to be read as "the at least one."
the term "video" refers broadly to any material represented in a video format (i.e., having a plurality of frames). In some instances, video may include a plurality of sequential frames that are identical or nearly identical, and that may give the impression of a "still" image. Video may also include frames that merely show a black screen, colorbars, testing data, or other traditionally non-substantive content. It should be noted that while non-substantive content may have little or no utility to a typical viewer, it provides useful information for the purpose of the techniques described throughout this disclosure. Video may or may not include an audio portion.
the term "video component" (VC) refers to video that one of ordinary skill in the art would typically consider to be self-contained, and that is typically separately scheduled by a scheduling-and-sequencing system (also commonly referred to as a traffic system) in a broadcasting environment. There are several types of VCs, including for example a show-segment VC, a barter VC, and a promotion VC. A show-segment VC consists of at least a portion of a show, and potentially one or more commercials, all of which are grouped together and considered as one unit for the purpose of scheduling-and-sequencing. A show may be, for example, an episode of a sitcom, a news program, or a movie. A barter VC consists of one or more commercials, all of which are grouped together and considered as one unit for the purpose of scheduling-and-sequencing. A barter VC is a subset of a show-segment VC, namely the portion including the one or more commercials. A promotion VC consists of a promotion or advertisement (e.g., for an associated show).
the term "video package" refers to a collection of VCs and other video, all of which has a logical or other relationship or association. Typically, the video package includes a plurality of sequentially ordered VCs that are separated by other video (e.g., black frames), although the video package may have the technical appearance of being a single, continuous piece of video when analyzed using traditional methods. Each video package includes at least one, and often a group of show-segment VCs that are intended to be aired during a corresponding thirty-minute, one-hour, two-hour, or other predefined time slot. Though not required, a video package is often created by a show syndicator and provided to a broadcaster.

TECHNICAL FIELD

The present systems and methods relate to video analysis and, more particularly, to systems and methods for identifying a video aspect-ratio frame attribute.

BACKGROUND

Video technology relates to electronically capturing, processing, recording, and reconstructing a sequence of still images referred to as frames, so as to represent motion. Video includes a number of frames based on a predefined frame rate. For example, in the U.S., the Advanced Television Systems Committee ("ATSC") establishes a standard frame rate of 29.97 frames/second for video used for commercial broadcasting.

For video transmitted via a digital video signal (e.g., based on the high definition serial digital interface (HD-SDI) standard), each frame is represented by a number of pixels commonly described as the smallest unit of an image that can be represented or controlled. The number of pixels in a frame is based on a predefined resolution of the frame (typically defined by a number of columns and rows of pixels). For example, a frame having a resolution of 1920 columns and 1080 rows is referred to as 1920×1080 and is represented by the arithmetic product of approximately 2,073,600 pixels. Pixels have many attributes, including for example, chrominance values that represent color, and luma values (referred to herein as lumas) that represent brightness. Once captured and processed, video is typically encoded and recorded as a digital file. Thereafter, the file is retrieved and the video is reconstructed by decoding the file.

A frame also has a signal aspect-ratio that defines the proportional relationship between the width and height of the frame. Since video includes a plurality of frames, video is also referred to as having a particular signal aspect-ratio (provided the signal aspect-ratio of its frames is uniform). In one example, a frame having a resolution of 1920×1080 has a signal aspect-ratio of 16:9 or ~1.77:1. This ratio is defined in the HD-SDI standard. Standard definition signals typically have a signal aspect-ratio of 4:3 or approximately 1.3:1. In addition to having a signal aspect-ratio, frames also have a video aspect-ratio that defines the aspect-ratio of the video (sometimes referred to as the active video) in the frame. A difference in the signal and video aspect-ratios typically results in horizontal or vertical black bars being included in the frame to adjust for such differences. Such is often the case when video is converted from one format to another.

For example, consider video having a 4:3 video aspect-ratio that was originally recorded in a standard definition analog format with a 4:3 signal aspect-ratio, and was converted to a high definition digital format based on the HD-SDI standard with a 16:9 signal aspect-ratio. While the resulting frames would have a 16:9 signal aspect-ratio (since that it what the signal supports), the video aspect-ratio remains at 4:3. To make up the difference in these dimensions, vertical black bars are added to the left and right edges of the frames and around the content. Similarly, for video having a 16:9 video aspect-ratio that is initially recorded in a format with a 16:9 signal aspect-ratio, but which is then converted to a format with a 4:3 signal aspect-ratio, the resulting frames may have horizontal black bars on the upper and lower edges of the frames and around the content.

When watching video on a display device, users often desire to "correct" the presence of black bars by modifying a display setting on the display device. For example, the display device may provide an option to select a full, letterbox, horizontal stretch, or pan-and-scan zoom mode, whereby select portions of the video are enlarged or shifted to reduce or eliminate the presence of black bars. While portions of the video may be lost, often users are willing to accept such a loss to have the screen "filled." However, while many users desire to modify such display settings, often users are unaware of their availability and/or do not take the time to modify them, particularly when they need to be changed repeatedly as the video changes (as, e.g., a user changes channels).

SUMMARY

Disclosed herein are systems and methods for identifying a video aspect-ratio frame attribute that provide several advantages.

One example advantage of the present systems and methods is the ability to identify a video aspect-ratio frame attribute while minimizing or eliminating false-positive and false-negative results.

Another example advantage of the present systems and methods is the ability to identify a video aspect-ratio frame attribute while minimizing the use of system resources.

Another example advantage of the present systems and methods is the ability to identify a video aspect-ratio frame attribute for a plurality of frames of video while contemporaneously processing each frame to create an encoded file, and wherein corresponding steps for each frame are performed during an execution time period that is less than a reciprocal of a frame rate of the video.

Another example advantage of the present systems and methods is the ability to automatically modify a display setting of a display device based on an identified video aspect-ratio frame attribute.

Various embodiments of the present system and method may have none, some, or all of these advantages. Other advantages will be readily apparent to one of ordinary skill in the art.

A first example embodiment takes the form of a frame-processing device including a processor and a non-transitory computer-readable medium containing instructions that, when executed by the processor, cause a set of steps to be carried out, the set of steps including: (i) receiving a frame of video from a video source device; (ii) defining a region of the received frame, wherein the region is associated with a plurality of pixels of the received frame; (iii) using a plurality of luma values associated with the plurality of pixels as a basis to identify the received frame as having a particular video aspect-ratio attribute; and (iv) storing in a memory an indication that the received frame has the identified particular video aspect-ratio frame attribute.

A second example embodiment takes the form of a non-transitory computer-readable medium containing instructions that, when executed by the processor, cause performance of a set of steps including: (i) receiving a frame of video from a video source device; (ii) defining a region of the received frame, wherein the region is associated with a plurality of pixels of the received frame; (iii) using a plurality of luma values associated with the plurality of pixels as a basis to identify the received frame as having a particular video aspect-ratio attribute; and (iv) storing in a memory an indication that the received frame has the identified particular video aspect-ratio frame attribute.

A third example embodiment takes the form of the method that involves (i) receiving a frame of video from a video source device; (ii) defining a region of the received frame, wherein the region is associated with a plurality of pixels of the received frame; (iii) using a plurality of luma values associated with the plurality of pixels as a basis to identify the received frame as having a particular video aspect-ratio attribute; and (iv) storing in a memory an indication that the received frame has the identified particular video aspect-ratio frame attribute.

BRIEF DESCRIPTION OF THE DRAWINGS

For a more complete understanding of the present systems and methods, reference is now made to the following descriptions, taken in conjunction with the accompanying drawings, in which.

DETAILED DESCRIPTION OF THE DRAWINGS

Figure 1:
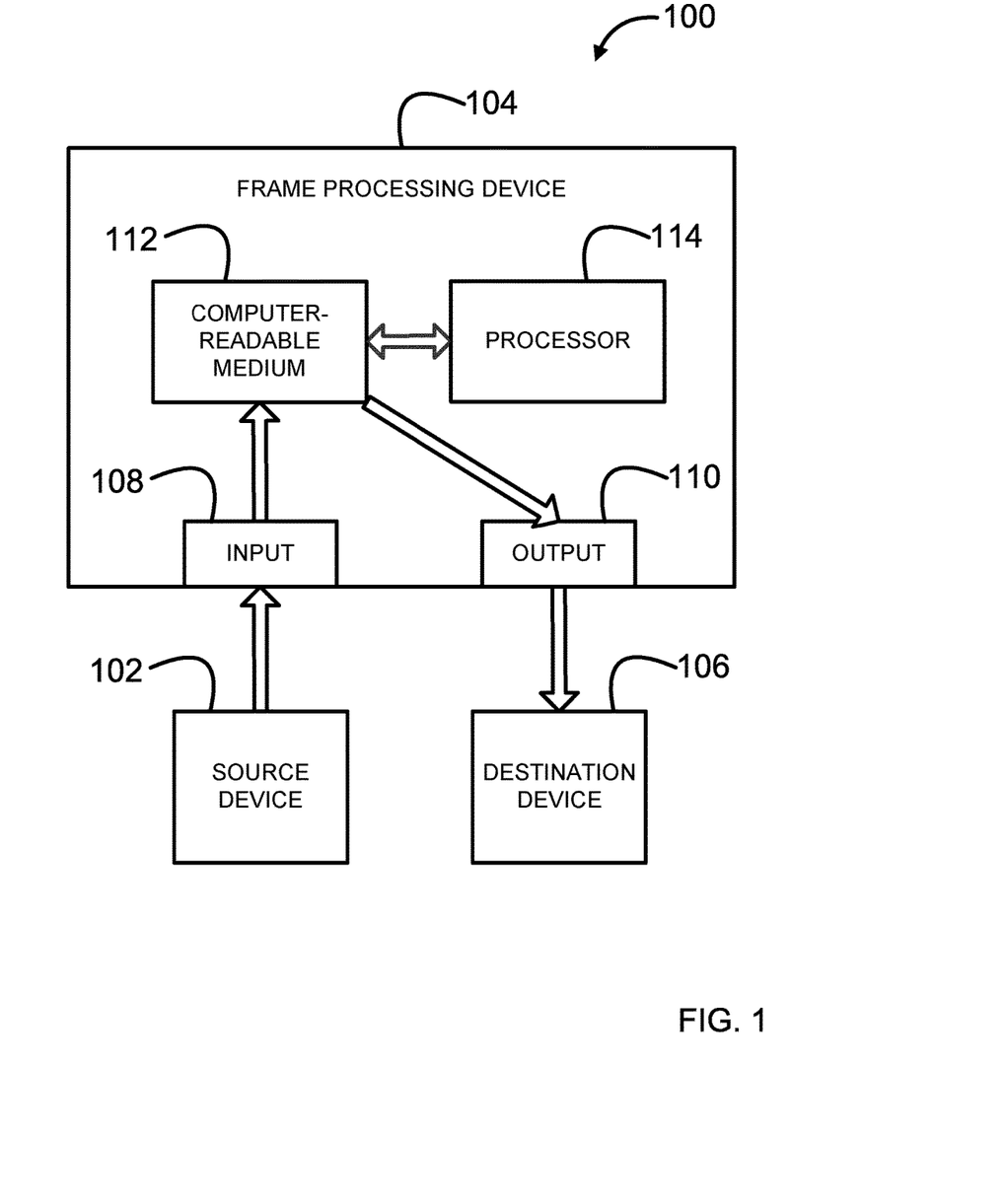
FIG. 1 is an example of a system in accordance with at least one embodiment.

Turning now to FIG. 1, an example system is provided and is generally designated 100. Included in the system 100 is a source device 102, a frame-processing device 104, and a destination device 106. Example source devices 102 include satellite receivers, decoders, baseband fiber transcoders, DVD players, Internet-delivery-based playout devices (e.g., Pathfire devices provided by DG FastChannel, Inc. of Irvine, Tex.), and other frame-processing devices. The frame-processing device 104 includes a video input connection 108 and is configured for receiving video via the video input connection from the source device 102. In one embodiment, the frame-processing device 104 is configured for receiving raw baseband video based on the HD-SDI standard with a data transfer rate in the range of 1.4 Gbps-1.6 Gbps (and typically approximately 1.485 Gbps). Throughout this application, unless otherwise stated, all disclosed ranges are inclusive of the stated bound values. It is contemplated that the frame-processing device 104 is optionally configured for receiving video based on other standards, including, but not limited to those defined by the Society of Motion Picture and Television Engineers ("SMPTE") as well as those of the ATSC.

A video output connection 110 on the frame-processing device 104 is configured for sending video to a destination device 106 (e.g., for playout of the video, and that may include the example source devices provided above). Further, the frame-processing device 104 includes a non-transitory computer-readable medium 112 and a processor 114. In the frame-processing device 104, the video input connection 108, the video output connection 110, the computer-readable medium 112, and the processor 114 may all be directly or indirectly electronically connected with one another. In the system 100, the video frame-processing device 104, the source device 102, and the destination device 106, are all directly or indirectly electronically connected (in one embodiment via the video input connection 108 and the video output connection 110).

Figure 2A:
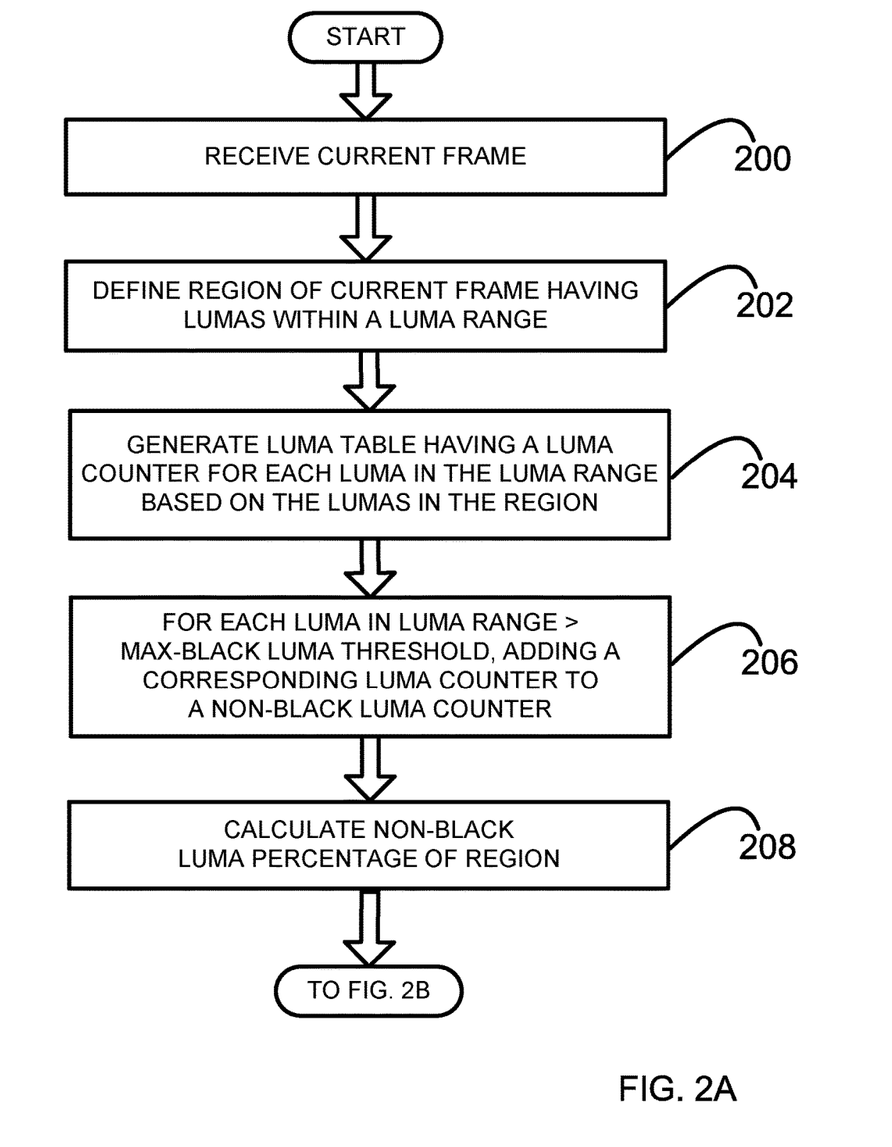
FIG. 2A is a first part of a flow chart illustrating an example of a method in accordance with at least one embodiment.
Figure 2B:
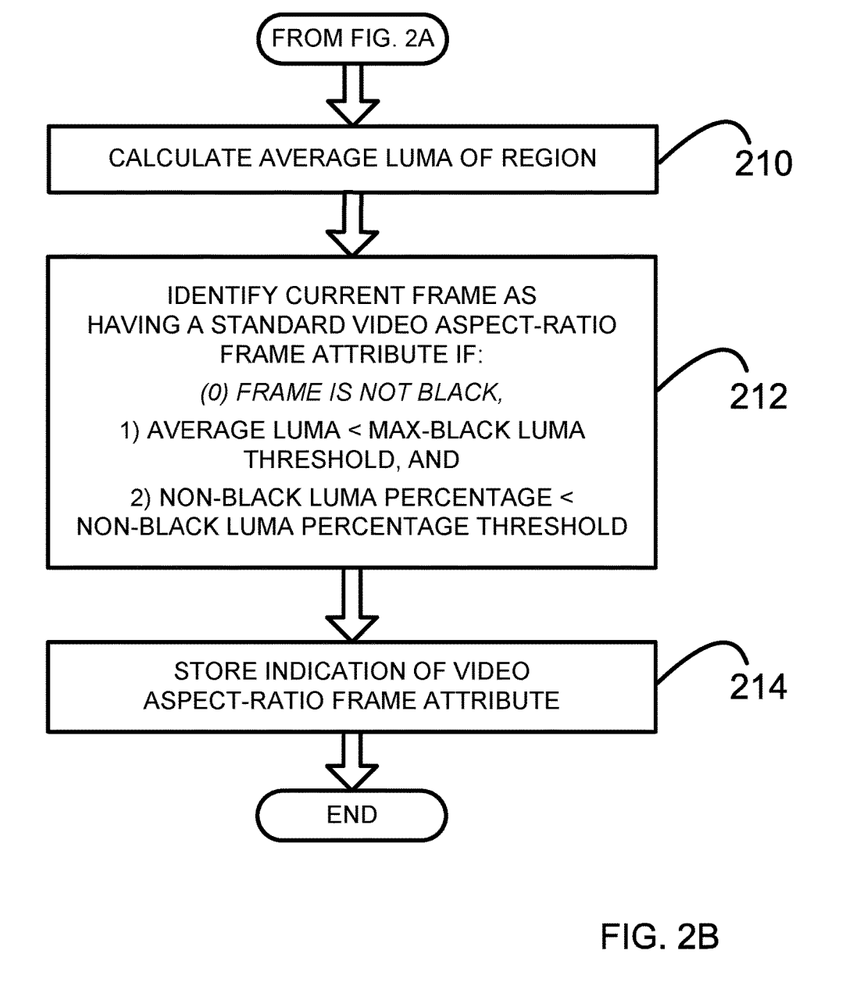
FIG. 2B is a second part of the flow chart of FIG. 2A.

The computer-readable medium 112 contains instructions that, when executed by the processor 114, cause a set of steps to be carried out for identifying a video aspect-ratio frame attribute. Turning now to FIGS. 2A and 2B, a flow chart illustrating the set of steps, and an example of the present method embodiment, is shown. It is noted that the described steps throughout this application need not be performed in the disclosed order, although in some embodiments, an order of select steps is preferred. Also, not all steps need to be performed to achieve the desired advantages of the presently disclosed system and method, and therefore not all steps are required.

As discussed above, video includes a plurality of frames, and in one embodiment the present method is applied to each frame. However, for clarity, the present method will be described with reference to a "current" frame of the video being received from the source device 102 (e.g., as the source device plays out the video), and received by the frame-processing device 104 via the video input connection 108. In step 200, a current frame of the video is received. As discussed above, a frame is represented as a plurality of pixels, with each pixel having a luma representing a level of brightness within a luma range. The present method analyzes lumas to identify a video aspect-ratio frame attribute. Such an approach reduces the use of system resources, as compared to, for example, the high processing power required to analyze chrominance values.

In some embodiments, the luma range may be defined by the video format. For example, 8-bit video may define a luma range of 0-255, while 10-bit video may define a luma range of 0-1023. However, in some instances, it may be desired to modify the defined luma range, such as to exclude so-called super-white and super-black levels that typically are not captured when the video is recorded. For example, for 10-bit video, a narrowed luma range of 64-940 may be used. In some embodiments, it may be desired to modify the defined luma range by using bit-shifting techniques. For example, by performing two right bit-shifts on the 10-bit video luma range of 0-1023, the luma range is reduced to 0-255. Among other things, this may allow for more efficient processing for calculations that involve luma values. For the described embodiments, this bit shifted luma range of 0-255 will be referenced (with 0 representing no brightness, i.e., completely black, and 255 representing full brightness, i.e., completely white), but as described above, different ranges are also contemplated and can be used.

Figure 3:
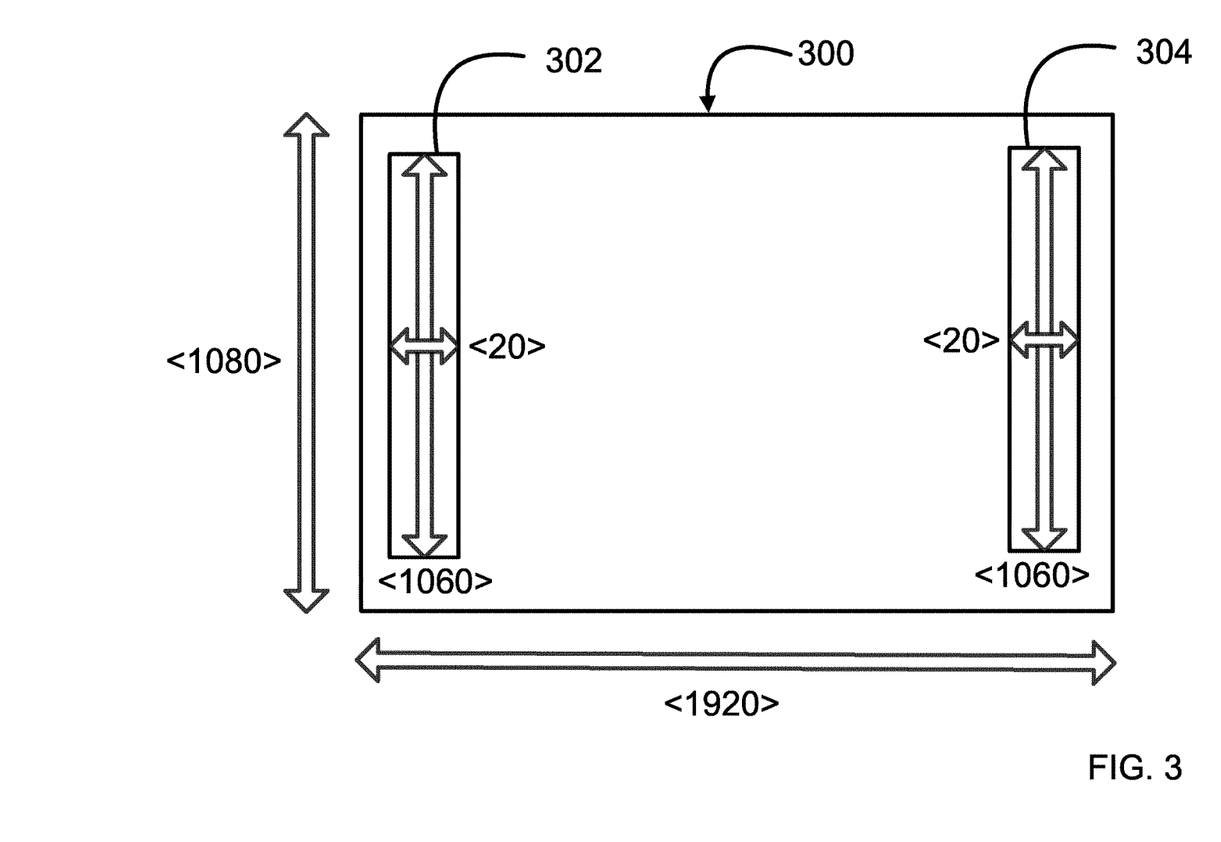
FIG. 3 depicts an example of a frame and a region in accordance with at least one embodiment.

In step 202, a region of the current frame is defined. An example of a current frame 300 and a corresponding region 302 are shown in FIG. 3 (not strictly drawn to scale). While the region 302 optionally includes the entire current frame 300, in one embodiment, the region 302 defines a lesser portion of the current frame 300. In one embodiment, the region 302 is a generally rectangular-shaped portion of the current frame 300 and is defined by a left-bound column, a right-bound column, a top-bound row, and a bottom-bound row. For a current frame 300 having a resolution of approximately 1920×1080, in one embodiment, the left-bound column is a value in a range 0-20, the right-bound column is a value in a range 20-40, the top-bound row is a value in a range 0-200, and the bottom-bound row is a value in a range 880-1080, and in a more specific embodiment, the values are 10, 30, 10, and 1070, respectively (thereby defining a region having a resolution of approximately 20×1060).

For frames having alternative resolutions, the bound ranges and values may be modified as desired and/or appropriate. In some embodiments, such modification may include scaling (e.g., proportionally) the ranges and/or values. In other embodiments, it may be desired to increase the size of the region, while generally maintaining the proximity of the borders of the region to the borders of the frame (since this is where static and noise typically occurs). Indeed, the specific size and shape of the region may vary to suit the application.

Since the current frame 300 includes lumas associated with each pixel, the corresponding region 302 includes a more defined set of lumas that are used to generate a luma table. Use of the region 302 helps to filter out portions of the current frame 300 that are likely to be affected by static or noise and/or helps to reduce the use of system resources as less lumas need to be analyzed. Notably, static or noise often occurs near the edges, and particularly the left and right edges, of a frame (e.g., as a result of clock heterodyne artifacts resulting from old transmission methods). In one embodiment, the region is positioned such that it overlays a portion of a left black bar that results from an aspect-ratio conversion (e.g. 4:3 to 16:9 as discussed in the background section).

Figure 4:
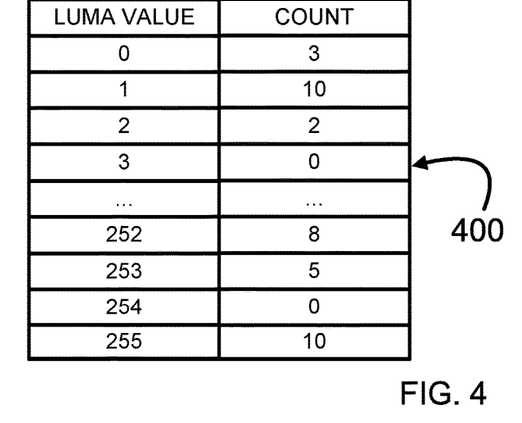
FIG. 4 depicts an example of a luma table in accordance with at least one embodiment.
Figure 5:
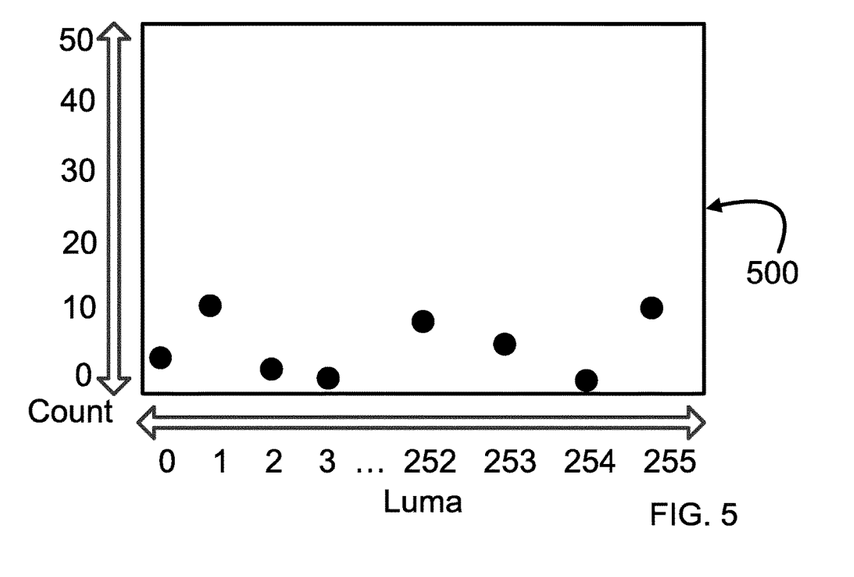
FIG. 5 depicts an example of a graphical representation of the luma table in FIG. 4.

In step 204, a luma table is generated that has a luma counter for each luma in the luma range based on the lumas in the region 302. An example luma table 400 for the current frame 300, and a corresponding graphical representation 500 of the luma table are shown in FIGS. 4 and 5, respectively. To maximize efficiency, in one embodiment, the luma table 400 is stored in a register memory (e.g., cache) included on the processor 114. Such a configuration greatly improves the speed at which values in the luma table 400 are retrieved, thereby increasing the execution speed of the present method.

Using the luma table 400, a non-black luma counter is calculated, that represents a count of lumas that exceed a max-black luma threshold. For a luma range 0-255, in one embodiment the max-black luma threshold is a value in a range 27-37, and in a more particular embodiment, is 32. To calculate the non-black luma counter, it is first initialized (e.g., set to 0), and in step 206, for each luma in the luma range that is greater than the max-black luma threshold, a corresponding luma value counter (identified in the luma value table) is added to the non-black luma counter. In one embodiment, all disclosed threshold values and ranges are predetermined (i.e., before performance of the steps in the present method).

In step 208, a non-black luma percentage of the region 302 is calculated based on the non-black luma counter. In one embodiment, the non-black luma percentage is calculated by dividing the non-black luma counter by a total luma count for the region 302. Notably, the above-described calculation need not be performed based on the described strict arithmetic calculation (i.e., calculating the identified percentage may be achieved using an alternate function). Further, as used herein the term "percentage" is not limited to a number represented as a fraction of one hundred, but instead refers to any expression of a quantity relative to another quantity, and may include for example, a ratio.

In step 210, an average luma is calculated based on the lumas in the region 302. Again, while an arithmetic average calculation may be used, such strictness need not be applied in making such a calculation, and therefore alternate functions can be used.

In step 212, the current frame is identified as having a "standard" video aspect-ratio frame attribute responsive to every condition in a condition set being satisfied. One condition—referred to here as a pre-condition, and noted as such using the number "(0)" and italic lettering—that can optionally first be tested is that the frame is not "black" (e.g., that the frame has a non-black attribute). Such a determination can be made using at least one technique described in the cross-referenced U.S. patent application Ser. No. 13/629,405, however other techniques known to those of ordinary skill in the art can also be employed. By testing this pre-condition, frames can be dropped from consideration if they are known to be black, and therefore, could not and would not have black bars surrounding content.

The first condition in the condition set is that the average luma (of the region 302) is less than the max-black luma threshold. This first condition ensures that the region 302 is, on average, sufficiently black. Testing this condition is likely to result in dropping many frames from consideration that have a non-standard (e.g., widescreen) video aspect-ratio. Indeed, such frames likely have content filling at least a portion of the region 302, which in most instances will cause the first condition not to be satisfied. The exception is where content is included in the region, but wherein that content is generally dark (i.e., causing a low average luma), such as a gray moon on a black background. However, such frames are addressed by the second condition as discussed below.

The second condition is that the non-black luma percentage (of the region 302) is less than a non-black luma percentage threshold, that for high definition frames is in one embodiment a value in a range 0.8-2.2%, and in a more particular embodiment, is approximately 1.0% or 2.0% (the determination of an appropriate value is discussed in greater detail below). This condition assists in dropping frames from consideration that, despite satisfying the first condition (and the pre-condition, if tested), contain content in the region 302, and therefore do not have a standard video aspect-ratio frame attribute. For example, consider the example frame described above, namely where the frame shows a gray moon on a black background. While the average luma of the frame may be low, the gray portions of the moon are likely to be deemed non-black (i.e., since the corresponding lumas exceed the max-black luma threshold) and are likely to represent a substantial enough percentage of the frame such that the percentage is greater than the non-black luma percentage threshold. Therefore, this example frame fails to satisfy the second condition, and is therefore identified as having a non-standard video aspect ratio frame attribute.

Notably, the non-black luma percentage threshold as discussed above is in one embodiment set based on characteristics of the video. For example, select video, such as that typically represented in a high definition format (e.g., 1920×1080), is less likely to have experienced format conversions or other modifications and therefore is less likely to have static or noise. As such, the non-black luma percentage threshold is in one embodiment lower (resulting in a stricter tolerance), such as approximately 1.0%. For video that likely encountered format conversions or other modifications and/or that has a relatively lower resolution, such as that represented in a standard definition frame (e.g., 640×480), the non-black luma percentage threshold is in one embodiment higher, such as approximately 2.0% to loosen the tolerance and allow for the additional static or noise.

To maximize efficiency, in one embodiment, short circuiting logic techniques are employed when testing the above-described conditions. As such, if one condition is not satisfied, the remaining conditions are not tested and the video aspect-ratio frame attribute is identified accordingly. In one embodiment, the three conditions (the pre-condition and the first and second conditions) are tested in the order recited, although notably such an order is not required. In step 214, the associated video aspect-ratio attribute in stored in a memory (e.g., in the computer-readable medium 112), among other things, for later retrieval and use by other applications.

Notably, in select embodiments, a second region may also be defined, that in one embodiment, is positioned on the opposite side of the frame (i.e., to potentially identify a right vertical black bar). An example of a second region 304 is shown in FIG. 3 (not strictly drawn to scale). In one embodiment, the second region 304 is a generally rectangular-shaped portion of the current frame 300 and is defined by a left-bound column, a right-bound column, a top-bound row, and a bottom-bound row. For a current frame 300 having a resolution of approximately 1920×1080, in one embodiment, the left-bound column is a value in a range 1880-1900, the right-bound column is a value in a range 1900-1920, the top-bound row is a value in a range 0-200, and the bottom-bound row is a value in a range 880-1080, and in a more particular embodiment, the values are 1890, 1910, 10, and 1070, respectively (thereby defining a region having a resolution of approximately 20×1060).

In alternate embodiments, the above-described steps are performed based on the second region 304 as described above. Further, depending on the desired configuration, analysis of the two regions 302, 304 may be combined, thereby requiring that the identifying step 212 satisfy the recited conditions with respect to both regions. Alternatively, it is contemplated that one or more regions also be defined in an upper or lower portion of the frame 300 (e.g., regions with short heights and relatively long widths) for use with identifying horizontal black bars (e.g., resulting from a frame having a signal aspect-ratio of 4:3, but with a video aspect-ratio of 16:9). In such instances, it may be desired to have the video aspect-ratio of the identified as "widescreen."

It should be noted that while specific regions have been discussed, together with specific video aspect radio attributes being identified (e.g., standard, non-standard, and widescreen), other regions and identifiers could be used depending on the desired configuration. For example, regions may be configured to identify many different video aspect-ratios (e.g., 3:2, 8:5, 1.618:1, 1.66, 1.85:1, and 2.39:1) with corresponding video aspect-radio attribute identifiers. In one embodiment, the video aspect-ratio identifiers are predetermined and based on a size and position of the region 302. (e.g., "standard" is used when the region 302 is configured to determine that the frame has a left black bar).

Also, for frames having alternative resolutions, the bound ranges and values may be modified as desired and/or appropriate. In some embodiments, such modification may include scaling (e.g., proportionally) the ranges and/or values. In other embodiments, it may be desired to increase the size of the region, while generally maintaining the proximity of the borders of the region to the borders of the frame (since this is where static and noise typically occurs). Indeed, the specific size and shape of the region may vary to suit the application.

In one embodiment, the steps of the present method are performed on each frame of baseband video as it is received across the video input connection 108 in real time or near real time. Such a configuration provides for performing the above-described steps while contemporaneously processing each frame to create an encoded file representing the video. Notably, when processing frames in real-time or near real-time (e.g., through use of a frame buffer), there is an inherent limitation in that above-described steps applied to a current frame must be performed during an execution time period that is less than a reciprocal of the frame rate of the video (e.g., the steps of the present method must be performed within 1/29.97 seconds for video having a frame rate of 29.97 frames per second). Such time constraints present considerable challenges, particularly when the video is being transferred at a high data rate as the amount of data and the complexity of the calculations carried out by the processor 114 increase. However, due at least in part to the various optimization techniques as described throughout this disclosure, the steps of the present method are capable of being performed within limited time constraints and/or with a reduced use of system resources.

Notably, a frame-attribute table (or other data structure such as a linked list) may be used to store the indication of the associated video aspect-ratio attribute in a memory as described above. As such, in one embodiment, a table may store such indications for all frames of a video package. Further, a separate frame-transition table may also be generated that indicates attribute changes or transitions between frames (e.g. the transition from a frame A having a widescreen aspect-ratio attribute to a frame B having a standard video aspect-ratio attribute may be indicated as a from-widescreen transition).

As one example of the efficiency of the present method, testing shows that the steps of the present method are capable of being performed contemporaneously while processing each frame for video based on the HD-SDI standard (i.e., having a transfer rate of approximately 1.485 Gbps and a frame rate of 29.97 frames per second) using a quad-core processor, with each core having a speed of 2 GHz (e.g., a Xeon E5405 processor provided by Intel® of Santa Clara, Calif.).

One particularly beneficial application of the present system and method is for use with systems and methods for electronically tagging a VC in a video package as described in the cross-referenced U.S. patent application Ser. No. 13/629,497. As discussed therein, the ability to identify a video aspect-ratio frame attribute with minimal processing power is particularly advantageous as select embodiments of the disclosed systems and methods for electronically tagging a VC in a video package rely on not only the identification of video aspect-ratio frame attributes, but also on the identification of several other frame attributes, that when combined, are restricted by the frame rate time constraints as described above.

Notably, in alternative embodiments, video may also be obtained by decompressing and/or decoding an encoded file such may be stored on the computer-readable medium 112, or stored on the source device 102. In addition, in alternate embodiments, the steps of the present method may be performed on each frame after baseband video is received from a video input connection 108 and processed and/or stored.

Another beneficial application of the present systems and methods is for use with a frame-processing device that also includes or is coupled to a display device, and is configured for (e.g., the set further includes the steps of) automatically modifying a display setting based on an identified video aspect-ratio frame attribute. For example, if the display device identifies a threshold count of consecutive frames having a video aspect-ratio frame attribute identified as "standard," the display device may automatically modify the display setting of the display device to horizontal stretch. It is further contemplated that a user may configure the display device to automatically modify display setting based on identified video aspect-ratio according to customized preferences.

Although the present systems and methods have been described in terms of select embodiments, alterations and permutations of these embodiments will be apparent to those skilled in the art. Accordingly, the above description of example embodiments does not define or constrain the present systems and methods.

In particular, it is noted that while some specific embodiments have been described using particular applied algorithms, the present systems and methods should not be construed as being limited to those particular implementations. For example, descriptions of iterative techniques can be implemented using recursive techniques, and vice-versa. Further, serial and parallel implementations can be interchanged. Similarly, it is contemplated that the use of logical structures including loops and condition statements can be modified, interchanged, or restricted without departing from the present system and method. Finally, it is contemplated that alternative data structure and storage techniques may be employed in implementing the techniques employed in the present systems and methods (e.g., data stored in a table may instead be stored in a linked-list, tree, or other data structure). Other changes, substitutions, and alterations are also possible without departing from the presently disclosed system and method in its broader aspects as set forth in the following claims.

The invention claimed is:

1. A display device configured for performing of a set of steps comprising:
   receiving a frame of video;
   defining a region of the received frame, wherein the region is associated with a plurality of pixels of the received frame;
   using a plurality of luma values associated with the plurality of pixels as a basis to identify the received frame as having a particular video aspect-ratio attribute; and
   modifying a display setting of the display device based on identifying the received frame as having the particular video aspect-ratio attribute.

2. The display device of claim 1, wherein using the plurality of luma values associated with the plurality of pixels as the basis to identify the received frame as having the particular video aspect-ratio attribute comprises identifying the received frame as having the particular video aspect-ratio attribute responsive to every condition in a condition set being satisfied.

3. The display device of claim 2, wherein using the plurality of luma values associated with the plurality of pixels of the received frame as the basis to identify the received frame as having the particular video aspect-ratio attribute further comprises (i) calculating a non-black luma value percentage of the plurality of luma values, and (ii) calculating an average luma value of the region based on the plurality of luma values; and wherein the condition set comprises first and second conditions, the first condition being that the average luma value is less than a max-black luma value threshold, and the second condition being that the non-black luma value percentage is less than a non-black luma value percentage threshold.

4. The display device of claim 1, wherein receiving the frame of video comprises receiving, via an video input connection, the frame of video from a video source device.

5. The display device of claim 1, wherein the region is defined by a left-bound column, a right-bound column, a top-bound row, and a bottom-bound row.

6. The display device of claim 5, wherein the received frame has a row count of 1080 and a column count of 1920, both defining a resolution of the received frame, and wherein the left-bound column is a value in a range 0-20, the right-bound column is a value in a range 20-40, the top-bound row is a value in a range 0-200, and the bottom-bound row is a value in a range 880-1080.

7. The display device of claim 1, wherein each luma value of the plurality of luma values is in a range of 0-255.

8. A non-transitory computer-readable medium containing instructions that, when executed by a processor, cause performance of a set of steps comprising:
    receiving a frame of video;
    defining a region of the received frame, wherein the region is associated with a plurality of pixels of the received frame;
    generating a luma table based on a plurality of luma values associated with the plurality of pixels;
    storing in a memory the generated luma table; and
    using the generated luma table as a basis to identify the received frame as having a particular video aspect-ratio attribute.

9. The non-transitory computer-readable medium of claim 8, the set of steps further comprising:
    modifying a display setting of a display device based on identifying the received frame as having the particular video aspect-ratio attribute.

10. The non-transitory computer-readable medium of claim 8, wherein receiving the frame of video comprises receiving, via an video input connection, the frame of video from a video source device.

11. The non-transitory computer-readable medium of claim 8, the set of steps further comprising:
    storing in a memory an indication that the received frame has the identified particular video aspect-ratio attribute.

12. The non-transitory computer-readable medium of claim 8, wherein the region is defined by a left-bound column, a right-bound column, a top-bound row, and a bottom-bound row.

13. The non-transitory computer-readable medium of claim 12, wherein the received frame has a row count of 1080 and a column count of 1920, both defining a resolution of the received frame, and wherein the left-bound column is a value in a range 0-20, the right-bound column is a value in a range 20-40, the top-bound row is a value in a range 0-200, and the bottom-bound row is a value in a range 880-1080.

14. A frame-processing device configured for performing a set of steps comprising:
    receiving a frame of video;
    defining a region of the received frame, wherein the region is associated with a plurality of pixels of the received frame;
    generating a luma table based on a plurality of luma values associated with the plurality of pixels; and
    storing in a memory the generated luma table; and
    using the generated luma table as a basis to identify the received frame as having a particular video aspect-ratio attribute.

15. The frame-processing device of claim 14, wherein receiving the frame of video comprises receiving, via an video input connection, the frame of video from a video source device.

16. The frame-processing device of claim 14, the set of steps further comprising:
    modifying a display setting of a display device based on identifying the received frame as having the particular video aspect-ratio attribute.

17. The frame-processing device of claim 14, the set of steps further comprising:
    storing in a memory an indication that the received frame has the identified particular video aspect-ratio attribute.

18. The frame-processing device of claim 14, wherein the region is defined by a left-bound column, a right-bound column, a top-bound row, and a bottom-bound row.

19. The frame-processing device of claim 18, wherein the received frame has a row count of 1080 and a column count of 1920, both defining a resolution of the received frame, and wherein the left-bound column is a value in a range 0-20, the right-bound column is a value in a range 20-40, the top-bound row is a value in a range 0-200, and the bottom-bound row is a value in a range 880-1080.

20. The frame-processing device of claim 14, wherein each luma value of the plurality of luma values is in a range of 0-255.

* * * * *